United States Patent
Chien et al.

(10) Patent No.: US 9,590,105 B2
(45) Date of Patent: Mar. 7, 2017

(54) SEMICONDUCTOR DEVICE WITH METAL ALLOY OVER FIN, CONDUCTIVE LAYER OVER CHANNEL REGION OF FIN, AND SEMICONDUCTIVE LAYER OVER CONDUCTIVE LAYER AND FORMATION THEREOF

(71) Applicants: Taiwan Semiconductor Manufacturing Company Limited, Hsin-Chu (TW); National Chiao-Tung University, Hsinchu (TW)

(72) Inventors: Chao-Hsin Chien, Hsinchu (TW); Cheng-Ting Chung, Hsinchu (TW); Che-Wei Chen, Taichung (TW)

(73) Assignees: National Chiao-Tung University, Hsinchu (TW); Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/246,408

(22) Filed: Apr. 7, 2014

(65) Prior Publication Data

US 2015/0287819 A1    Oct. 8, 2015

(51) Int. Cl.
*H01L 29/78*    (2006.01)
*H01L 29/66*    (2006.01)
*H01L 29/10*    (2006.01)

(52) U.S. Cl.
CPC ........ *H01L 29/785* (2013.01); *H01L 29/1054* (2013.01); *H01L 29/66795* (2013.01)

(58) Field of Classification Search
CPC ............. H01L 29/785; H01L 29/66795; H01L 27/1211; H01L 27/823431; H01L 27/845
See application file for complete search history.

(56) References Cited

U.S. PATENT DOCUMENTS 6,300,182 B1 * 10/2001 Yu .................................. 438/217
7,078,299 B2 * 7/2006 Maszara et al. ............... 438/285
(Continued)

FOREIGN PATENT DOCUMENTS

WO      2007046150 A1     4/2007

OTHER PUBLICATIONS

Corresponding Korean application 10-2014-0184619, Korean Office action dated Jan. 21, 2016.
(Continued)

*Primary Examiner* — Matthew Landau
*Assistant Examiner* — Grant Withers
(74) *Attorney, Agent, or Firm* — Cooper Legal Group, LLC

(57) ABSTRACT

A semiconductor device and methods of formation are provided. The semiconductor device includes a first metal alloy over a first active region of a fin and a second metal alloy over a second active region of the fin. A conductive layer is over a channel region of the fin. A semiconductive layer is over the conductive layer. The conductive layer over the channel region suppresses current leakage and the semiconductive layer over the conductive layer reduces electro flux from a source to a drain, as compared to a channel region that does not have such a conductive layer or a semiconductive layer over a conductive layer. The semiconductor device having the first metal alloy as at least one of the source or drain requires a lower activation temperature than a semiconductor device that does not have a metal alloy as a source or a drain.

20 Claims, 17 Drawing Sheets

(56) References Cited

U.S. PATENT DOCUMENTS

| | | | |
|---|---|---|---|
| 8,110,467 B2* | 2/2012 | Chang et al. | 438/277 |
| 8,445,334 B1* | 5/2013 | Basker et al. | 438/149 |
| 8,455,313 B1* | 6/2013 | Basker et al. | 438/197 |
| 8,604,546 B1* | 12/2013 | Bryant et al. | 257/347 |
| 8,878,300 B1* | 11/2014 | Liu et al. | 257/368 |
| 2003/0113970 A1* | 6/2003 | Fried | H01L 29/42384 438/286 |
| 2004/0061191 A1* | 4/2004 | Paton et al. | 257/412 |
| 2004/0145000 A1* | 7/2004 | An | H01L 29/42384 257/270 |
| 2005/0148137 A1* | 7/2005 | Brask et al. | 438/216 |
| 2005/0239242 A1* | 10/2005 | Zhu et al. | 438/199 |
| 2005/0285186 A1* | 12/2005 | Fujiwara | 257/327 |
| 2006/0017119 A1* | 1/2006 | Jin et al. | 257/401 |
| 2006/0071275 A1* | 4/2006 | Brask et al. | 257/350 |
| 2006/0071291 A1* | 4/2006 | Yagishita | 257/471 |
| 2006/0118876 A1* | 6/2006 | Lee et al. | 257/365 |
| 2006/0192258 A1* | 8/2006 | Tsuchiya et al. | 257/412 |
| 2006/0275988 A1* | 12/2006 | Yagishita et al. | 438/275 |
| 2007/0001219 A1* | 1/2007 | Radosavljevic et al. | 257/327 |
| 2007/0075351 A1* | 4/2007 | Schulz et al. | 257/314 |
| 2008/0050898 A1* | 2/2008 | Luan | 438/585 |
| 2008/0203440 A1* | 8/2008 | Tsuchiaki | 257/255 |
| 2008/0237577 A1* | 10/2008 | Chui et al. | 257/24 |
| 2008/0265321 A1* | 10/2008 | Yu et al. | 257/344 |
| 2009/0008716 A1* | 1/2009 | Goto et al. | 257/365 |
| 2009/0008726 A1* | 1/2009 | Yamauchi et al. | 257/412 |
| 2009/0061568 A1* | 3/2009 | Bangsaruntip et al. | 438/151 |
| 2009/0152623 A1* | 6/2009 | Goto et al. | 257/329 |
| 2009/0179244 A1* | 7/2009 | Ono | 257/295 |
| 2010/0151639 A1* | 6/2010 | Shue | H01L 29/665 438/197 |
| 2010/0264497 A1* | 10/2010 | Chang et al. | 257/393 |
| 2011/0062443 A1* | 3/2011 | Maszara | 257/57 |
| 2011/0089493 A1* | 4/2011 | Lander | 257/347 |
| 2011/0095378 A1* | 4/2011 | Lee et al. | 257/401 |
| 2011/0117679 A1* | 5/2011 | Lee et al. | 438/5 |
| 2011/0127611 A1* | 6/2011 | Lee | 257/368 |
| 2011/0133292 A1* | 6/2011 | Lee et al. | 257/401 |
| 2011/0278676 A1* | 11/2011 | Cheng et al. | 257/369 |
| 2011/0303972 A1* | 12/2011 | Saitoh et al. | 257/329 |
| 2012/0074386 A1* | 3/2012 | Rachmady et al. | 257/24 |
| 2012/0146053 A1* | 6/2012 | Saitoh et al. | 257/77 |
| 2012/0164800 A1* | 6/2012 | Ikeda | 438/151 |
| 2012/0319190 A1* | 12/2012 | Zhu et al. | 257/329 |
| 2013/0043563 A1* | 2/2013 | Nakazawa | H01L 29/7851 257/607 |
| 2013/0105897 A1* | 5/2013 | Bangsaruntip | B82Y 10/00 257/351 |
| 2013/0122672 A1* | 5/2013 | Or-Bach et al. | 438/199 |
| 2013/0134506 A1* | 5/2013 | Yagishita | 257/330 |
| 2013/0146977 A1* | 6/2013 | Yin et al. | 257/351 |
| 2013/0153993 A1* | 6/2013 | Chang | B82Y 10/00 257/330 |
| 2013/0178020 A1* | 7/2013 | Cai et al. | 438/151 |
| 2013/0181274 A1* | 7/2013 | Saitoh | H01L 29/78 257/314 |
| 2013/0187206 A1* | 7/2013 | Mor et al. | 257/288 |
| 2013/0198695 A1* | 8/2013 | Bryant et al. | 716/50 |
| 2013/0228876 A1* | 9/2013 | Mor et al. | 257/401 |
| 2013/0230953 A1* | 9/2013 | Sudo | 438/268 |
| 2013/0299885 A1* | 11/2013 | Zhu et al. | 257/288 |
| 2014/0001520 A1* | 1/2014 | Glass et al. | 257/288 |
| 2014/0042386 A1* | 2/2014 | Cea | H01L 29/42392 257/9 |
| 2014/0061734 A1* | 3/2014 | Basker et al. | 257/288 |
| 2014/0084239 A1* | 3/2014 | Radosavljevic | H01L 29/0665 257/12 |
| 2014/0159167 A1* | 6/2014 | Basker et al. | 257/410 |
| 2014/0175543 A1* | 6/2014 | Glass et al. | 257/337 |
| 2014/0183633 A1* | 7/2014 | Chen et al. | 257/347 |
| 2014/0209855 A1* | 7/2014 | Cea | H01L 29/41791 257/9 |
| 2014/0239395 A1* | 8/2014 | Basker et al. | 257/347 |
| 2015/0035069 A1* | 2/2015 | Hung et al. | 257/369 |
| 2015/0076603 A1* | 3/2015 | Yin et al. | 257/347 |
| 2015/0084102 A1* | 3/2015 | Park | 257/288 |
| 2015/0084134 A1* | 3/2015 | Lin et al. | 257/384 |
| 2015/0102409 A1* | 4/2015 | Cheng et al. | 257/347 |
| 2015/0221676 A1* | 8/2015 | Holt | H01L 29/66795 257/347 |
| 2015/0270373 A1* | 9/2015 | Horak | H01L 29/66545 257/401 |

OTHER PUBLICATIONS

Corresponding Korean application 10-2014-0184619, Korean Office action dated Aug. 8, 2016.

* cited by examiner

SEMICONDUCTOR DEVICE WITH METAL ALLOY OVER FIN, CONDUCTIVE LAYER OVER CHANNEL REGION OF FIN, AND SEMICONDUCTIVE LAYER OVER CONDUCTIVE LAYER AND FORMATION THEREOF

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
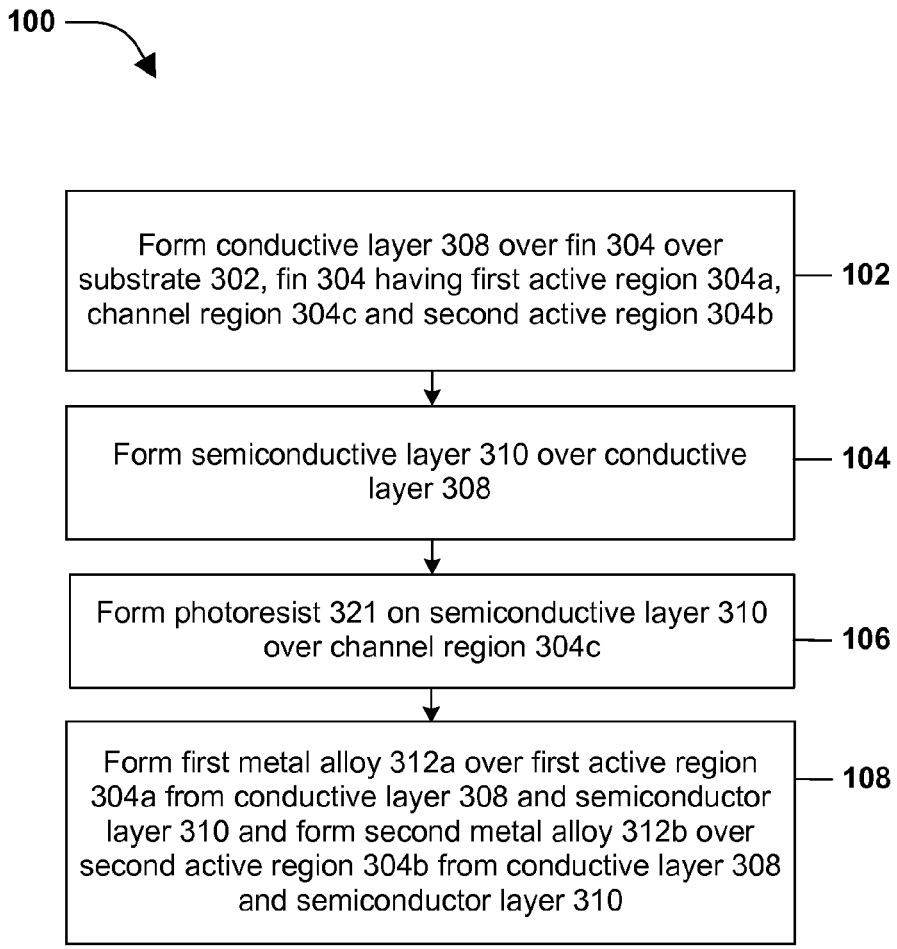
FIG. 1 is a flow diagram illustrating a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 3:
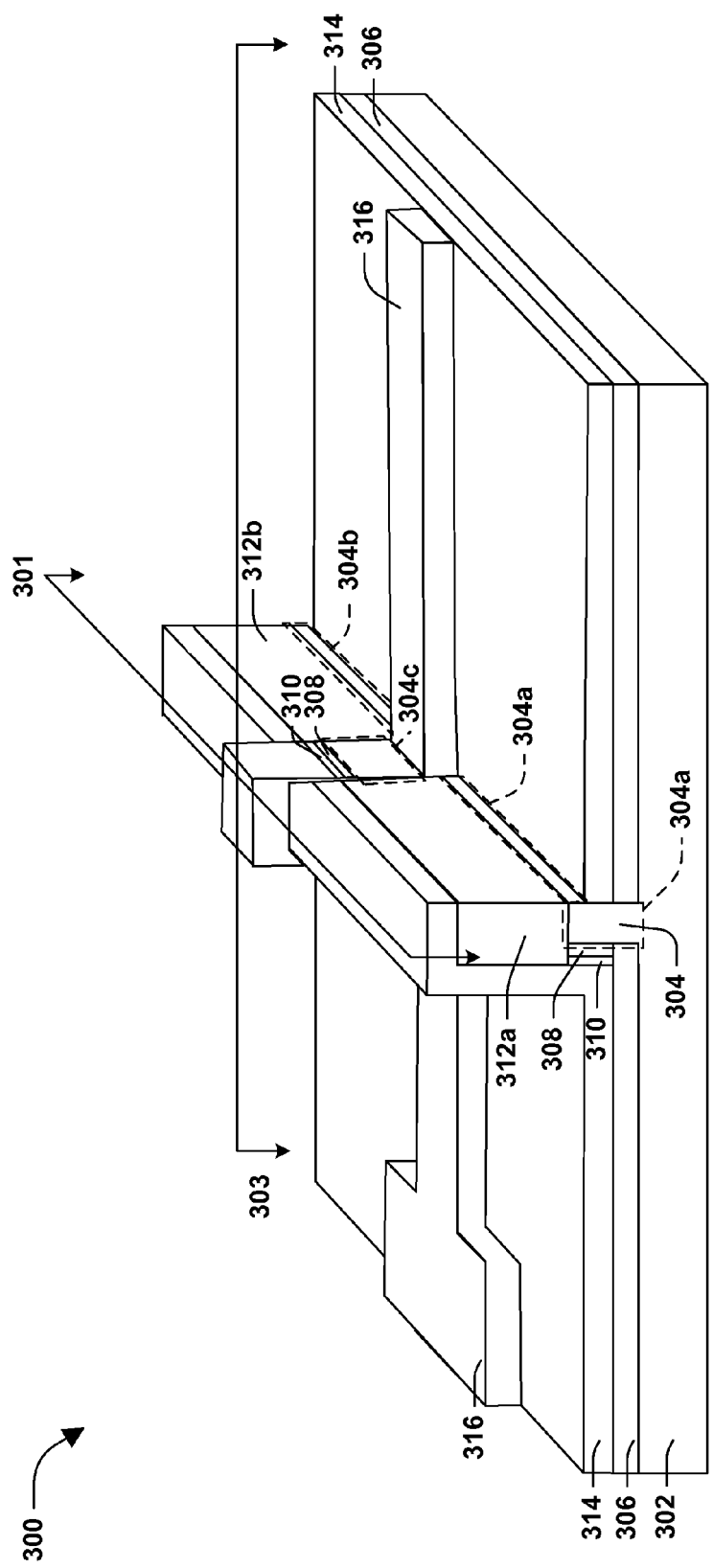
FIG. 3 is an illustration of a semiconductor device, in accordance with some embodiments.

A first method 100 of forming a semiconductor device 300 is illustrated in FIG. 1, and one or more semiconductor devices formed by such methodology are illustrated in FIGS. 3-18. Turning to FIG. 3, a 3 dimensional (3D) view of the semiconductor device 300 is illustrated, where a portion of an insulating layer 314, a semiconductive layer 310 and a conductive layer 308 illustrated in FIGS. 14-18 are not shown in FIG. 3 so that features underlying the insulating layer 314, the semiconductive layer 310 and the conductive layer 308 are visible in FIG. 3. In some embodiments, the semiconductor device 300 comprises a fin 304 over a substrate 302. In some embodiments, the fin 304 comprises a first active region 304a, a channel region 304c and a second active region 304b. In some embodiments, a first dielectric layer 306 is over the substrate 302, and the insulating layer 314 is over the first dielectric layer 306 and the fin 304. In some embodiments, the conductive layer 308 is on sidewalls of the fin 304 in the first active region 304a under a first metal alloy 312a and in the second active region 304b under a second metal alloy 312b. In some embodiments, the conductive layer 308 comprises germanium. In some embodiments, the conductive layer 308 is over and on the sidewalls of the fin 304 in the channel region 304c. In some embodiments, the semiconductive layer 310 is over the conductive layer 308 on the sidewalls of the fin 304 in the first active region 304a under the first metal alloy 312a and in the second active region 304b under the second metal alloy 312b. In some embodiments, the semiconductive layer 310 is over the conductive layer 308 in the channel region 304c. In some embodiments, the semiconductive layer 310 comprises silicon. In some embodiments, the conductive layer 308 has a conductive layer thickness 311, depicted inter alia in FIG. 10, between about 0.5 nm to about 5 nm. In some embodiments, the semiconductive layer 310 is over the conductive layer 308 over the fin 304 in the channel region 304c. In some embodiments, the semiconductive layer 310 has a semiconductive layer thickness 313, depicted inter alia in FIG. 10, between about 0.1 nm to about 3 nm. In some embodiments, at least one of the first metal alloy 312a or the second metal alloy 312b comprises at least one of nickel, platinum, gold, tantalum, gadolinium, titanium, germanium or silicon. In some embodiments, at least one of the first metal alloy 312a or the second metal alloy 312b comprises at least one of a source or a drain. In some embodiments, the conductive layer 308 having the conductive layer thickness 311 over the channel region 304c suppresses current leakage as compared to a conductive layer having a thickness different than the conductive layer thickness 311. In some embodiments, the semiconductive layer 310 over the conductive layer 308 in the channel region 304c reduces electro flux from the source to the drain, as compared to a channel region that does not have a semiconductive layer over a conductive layer. In some embodiments, the semiconductor device 300 having the first metal alloy 312a as at least one of the source or drain and the second metal alloy 312b as at least one of the source or drain requires a lower activation temperature than a semiconductor device that does not have a metal alloy as at least one of a source or a drain.

In FIG. 3 two lines 301 and 303 are drawn to illustrate cross-sections that are depicted in other Figs. A first line 301 cuts through a metal layer 316, the insulating layer 314, the semiconductive layer 310, the conductive layer 308, the first metal alloy 312a, the second metal alloy 312b, the fin 304 and the substrate 302, and. FIGS. 4, 6, 8, 10, 12, 14 and 16 are cross sectional views of the semiconductor device 300 taken along the first line 301 at various stages of fabrication. A second line 303 cuts through the metal layer 316, the insulating layer 314, the semiconductive layer 310, the conductive layer 308, the first dielectric layer 306, the fin 304 and the substrate 302, FIGS. 5, 7, 9, 11 13, 15, and 17 are cross sectional views of the semiconductor device 300 taken along the second line 303 at various stages of fabrication.

Figure 4:
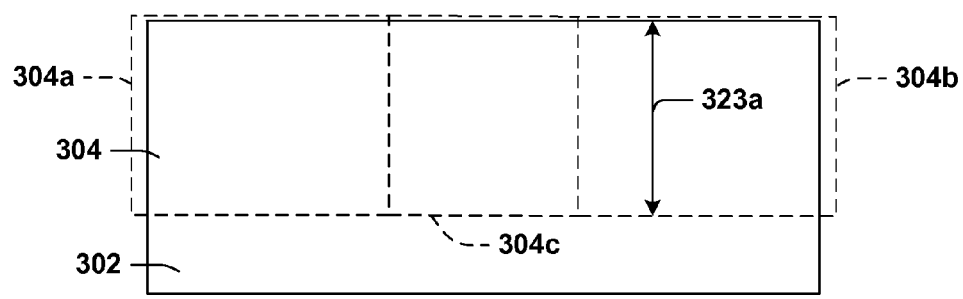
FIG. 4 is an illustration of a semiconductor device, in accordance with some embodiments.
Figure 5:
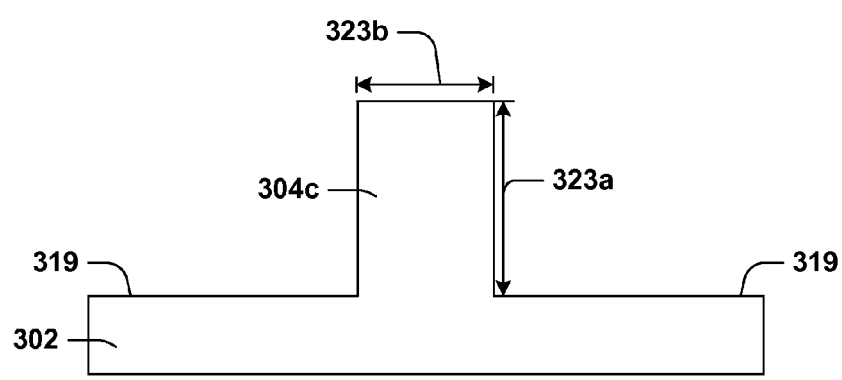
FIG. 5 is an illustration of a semiconductor device, in accordance with some embodiments.
Figure 6:
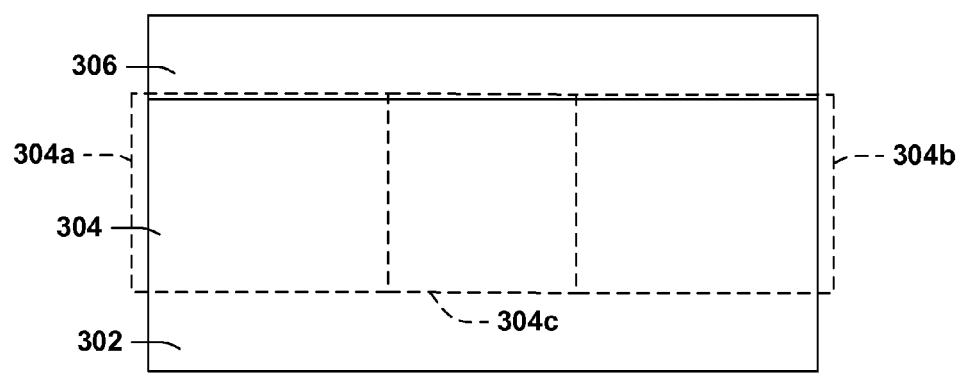
FIG. 6 is an illustration of a semiconductor device, in accordance with some embodiments.
Figure 7:
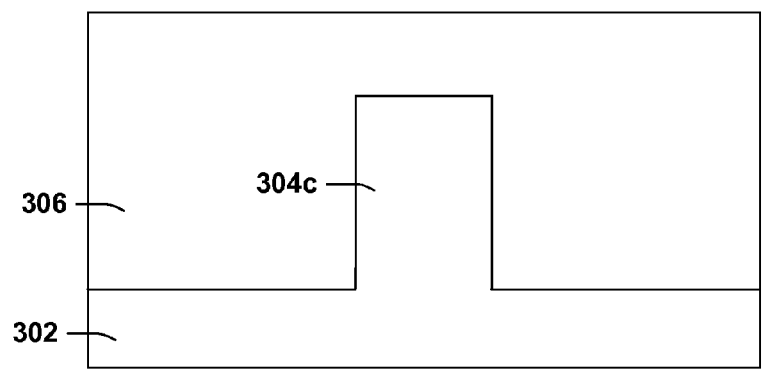
FIG. 7 is an illustration of a semiconductor device, in accordance with some embodiments.
Figure 8:
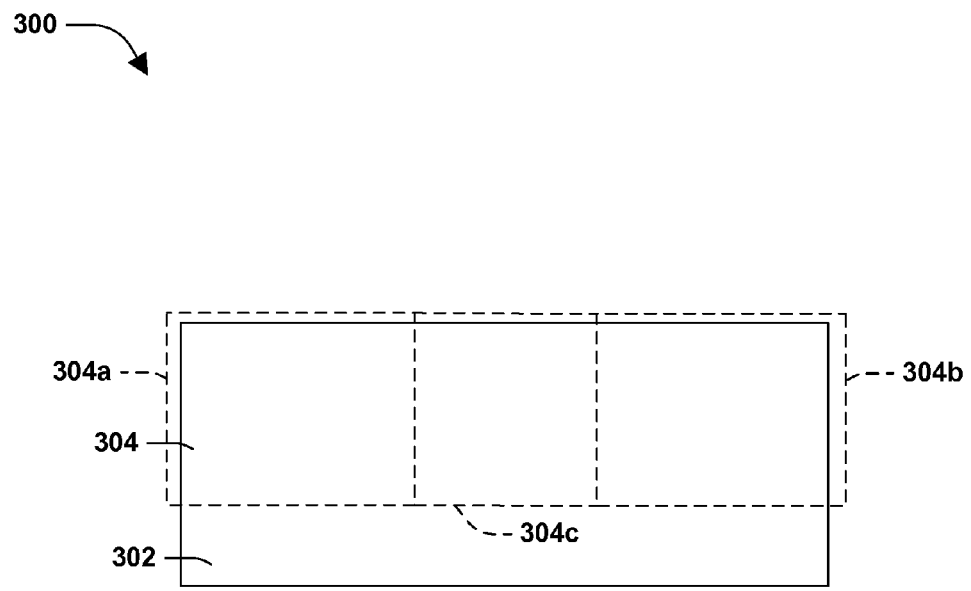
FIG. 8 is an illustration of a semiconductor device, in accordance with some embodiments.
Figure 9:
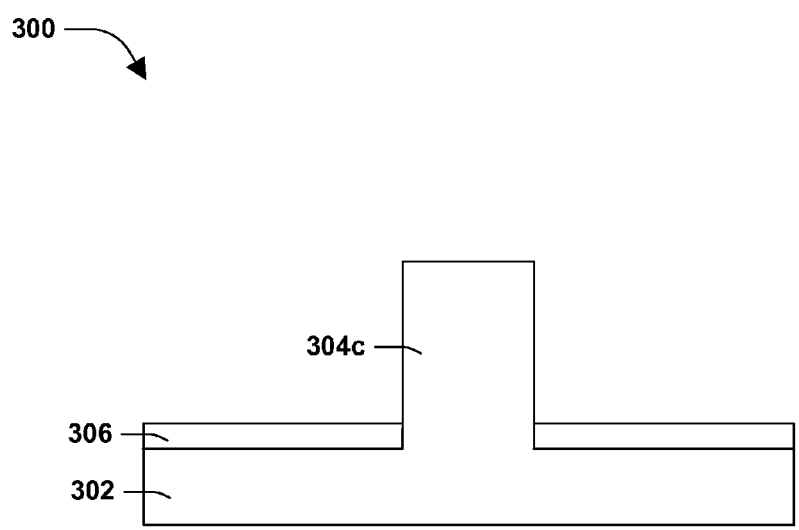
FIG. 9 is an illustration of a semiconductor device, in accordance with some embodiments.
Figure 10:
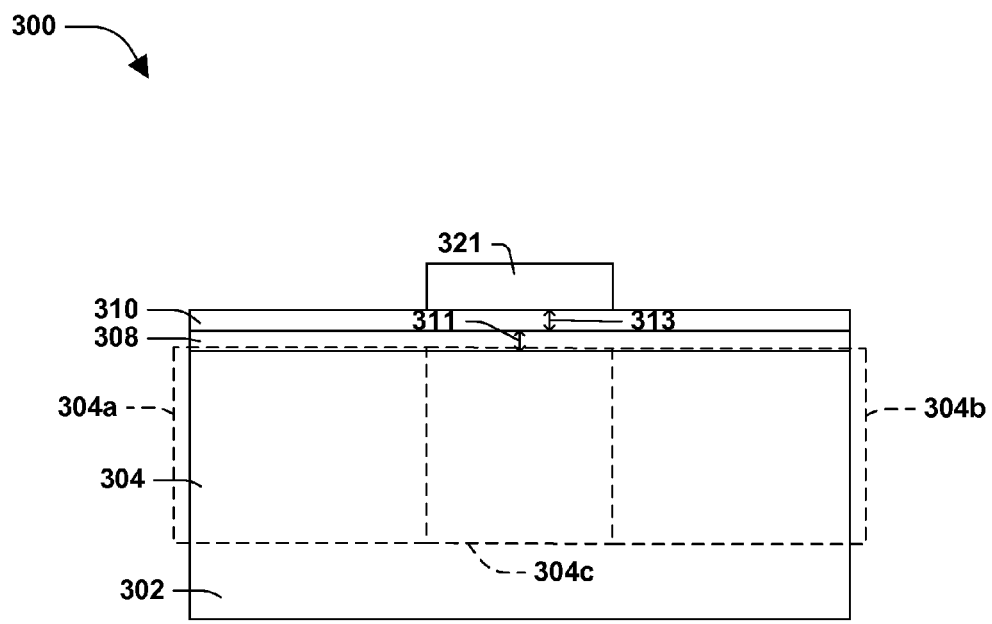
FIG. 10 is an illustration of a semiconductor device, in accordance with some embodiments.
Figure 11:
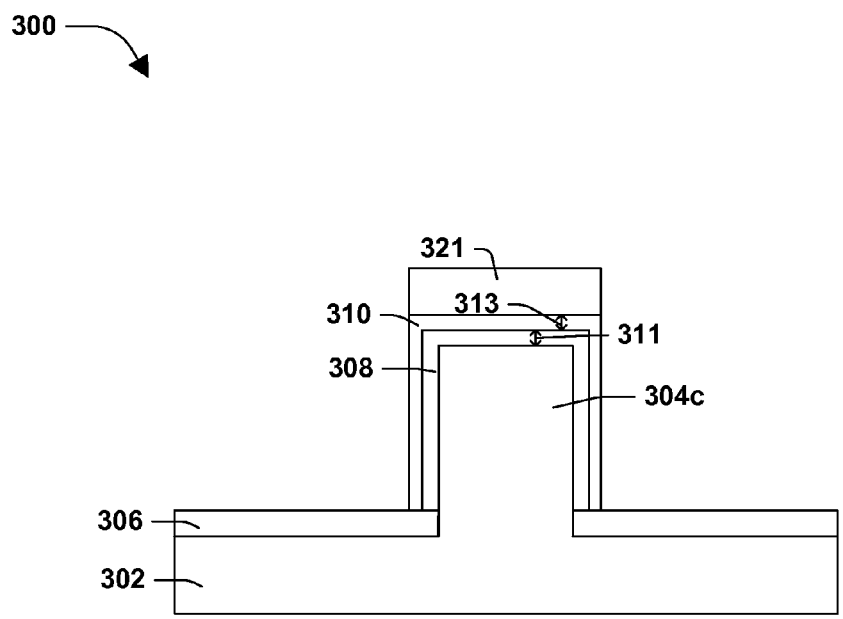
FIG. 11 is an illustration of a semiconductor device, in accordance with some embodiments.

At 102 of the first method 100, as illustrated in FIGS. 10 and 11, the conductive layer 308 is formed over the fin 304 over the substrate 302, according to some embodiments. Turning to FIGS. 4 and 5, prior to FIGS. 10 and 11, the fin 304 is formed from the substrate 302, such as by etching, according to some embodiments. In some embodiments, the substrate 302 comprises at least one of silicon or germanium. According to some embodiments, the substrate 302 comprises at least one of an epitaxial layer, a silicon-on-insulator (SOI) structure, a wafer, or a die formed from a wafer. In some embodiments, the fin 304 has the first active region 304a, the channel region 304c and the second active region 304b. In some embodiments, the fin 304 has a fin height 323a between about 20 nm to about 70 nm and a fin width 323b between about 10 nm to about 30 nm. Turning to FIGS. 6 and 7, the first dielectric layer 306 is formed over the substrate 302 and the fin 304, according to some embodiments. In some embodiments, the first dielectric layer 306 comprises at least one of silicon or oxide. In some embodiments, the first dielectric layer 306 is formed by deposition. Turning to FIGS. 8 and 9, the first dielectric layer 306 is etched such that the first dielectric layer 306 is removed from a top surface of the fin 304 and a portion of the sidewalls of the fin 304 and such that the first dielectric layer 306 remains over a top surface 319 of the substrate 302, as illustrated in FIG. 5. Turning to FIGS. 10 and 11, the conductive layer 308 is formed over the fin 304, according to some embodiments. In some embodiments, the conductive layer 308 comprises germanium. In some embodiments, the conductive layer 308 is grown, such as by epitaxial growth. In some embodiments, the conductive layer 308 is grown at a conductive temperature between about 400° C. to about 500° C. In some embodiments, the conductive layer 308 is grown at a conductive pressure between about 2 mTorr to about 15 mTorr. In some embodiments, the conductive layer 308 is grown in the presence of a conductive layer gas comprising $GeH_4$ introduced at a conductive layer flow rate between about 5 sccm to about 15 sccm. In some embodiments, the conductive layer 308 is formed at a conductive layer deposition rate between about 1 nm/min to about 4 nm/min. In some embodiments, the conductive layer 308 has the conductive layer thickness 311 between about 0.5 nm to about 5 nm.

At 104 of the first method of 100, as illustrated in FIGS. 10 and 11, the semiconductive layer 310 is formed over the conductive layer 308, according to some embodiments. In some embodiments, the semiconductive layer 310 comprises silicon. In some embodiments, the semiconductive layer 310 is grown, such as by epitaxial growth. In some embodiments, the semiconductive layer 310 is grown at a semiconductive temperature between about 600° C. to about 700° C. In some embodiments, the semiconductive layer 310 is grown at a semiconductive pressure between about 0.2 mTorr to about 2 mTorr. In some embodiments, the semiconductive layer 310 is grown in the presence of a semiconductive layer gas comprising $SiH_4$ introduced at a semiconductive layer flow rate between about 0.2 sccm to about 2 sccm. In some embodiments, the semiconductive layer 310 is formed at a semiconductive layer deposition rate between about 0.5 nm/min to about 2 nm/min. In some embodiments, the semiconductive layer 310 has the semiconductive layer thickness 313 between about 0.1 nm to about 3 nm.

At 106 of the first method of 100, as illustrated in FIGS. 10 and 11, a photoresist 321 is formed on the semiconductive layer 310 over the channel region 304c, according to some embodiments.

Figure 12:
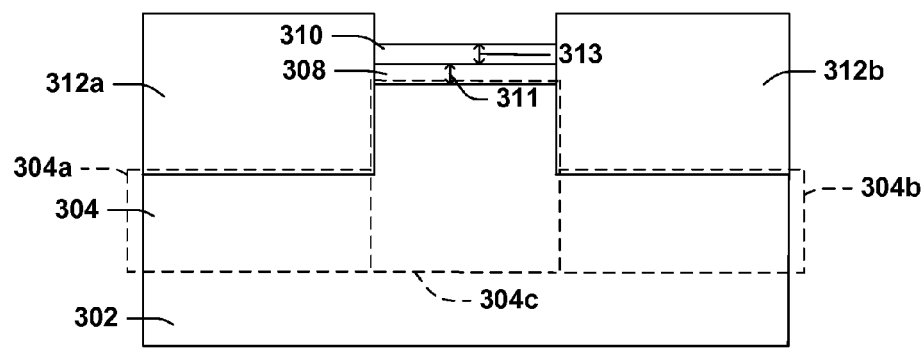
FIG. 12 is an illustration of a semiconductor device, in accordance with some embodiments.
Figure 13:
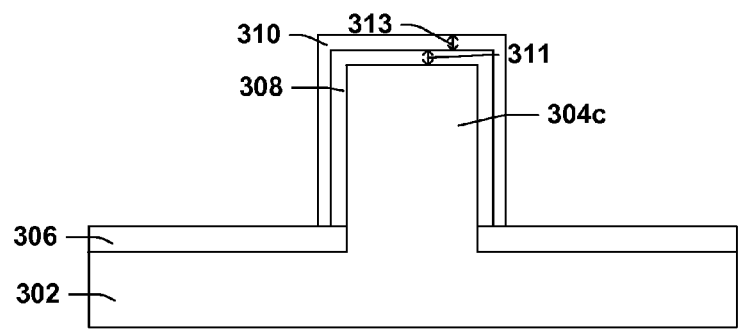
FIG. 13 is an illustration of a semiconductor device, in accordance with some embodiments.
Figure 14:
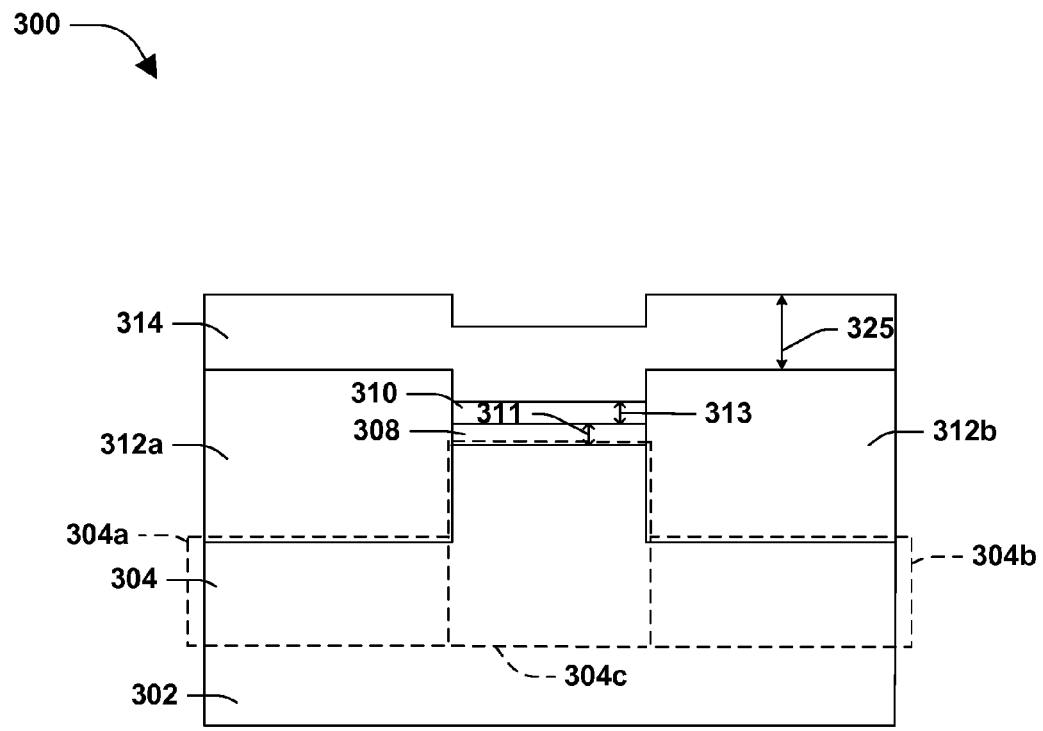
FIG. 14 is an illustration of a semiconductor device, in accordance with some embodiments.
Figure 15:
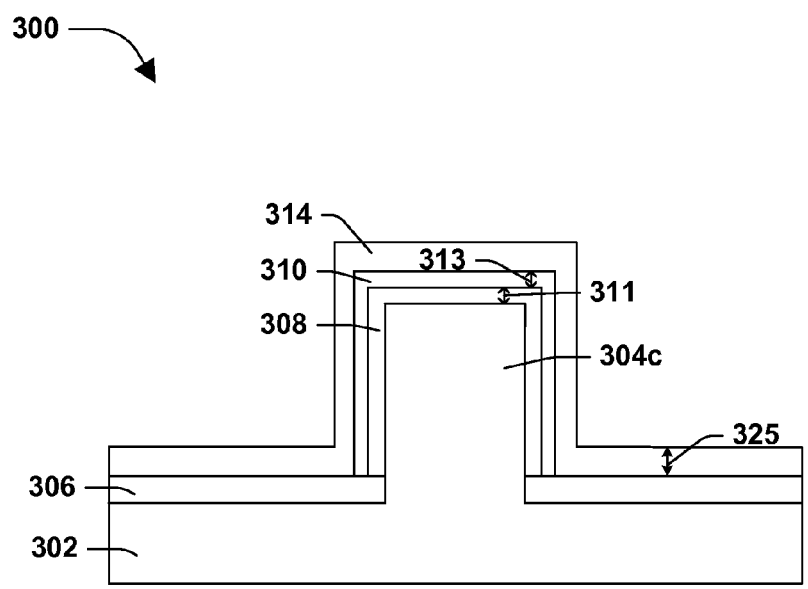
FIG. 15 is an illustration of a semiconductor device, in accordance with some embodiments.
Figure 16:
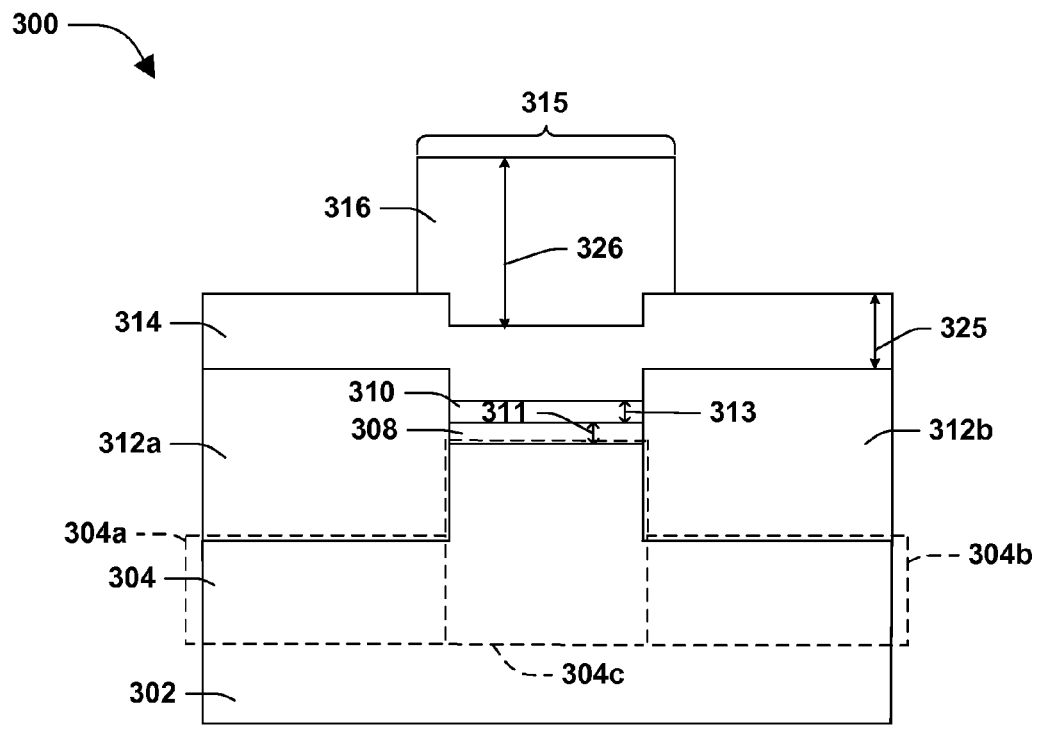
FIG. 16 is an illustration of a semiconductor device, in accordance with some embodiments.
Figure 17:
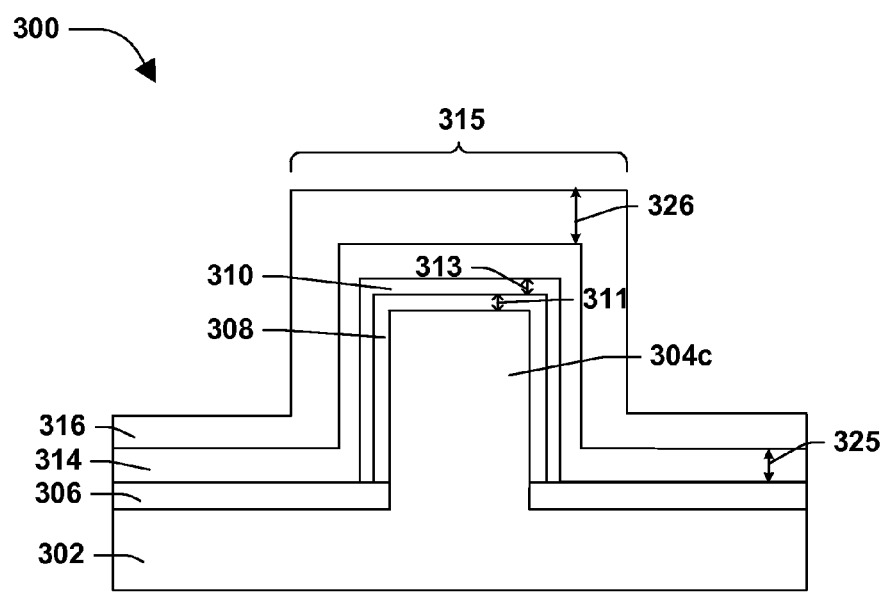
FIG. 17 is an illustration of a semiconductor device, in accordance with some embodiments.
Figure 18:
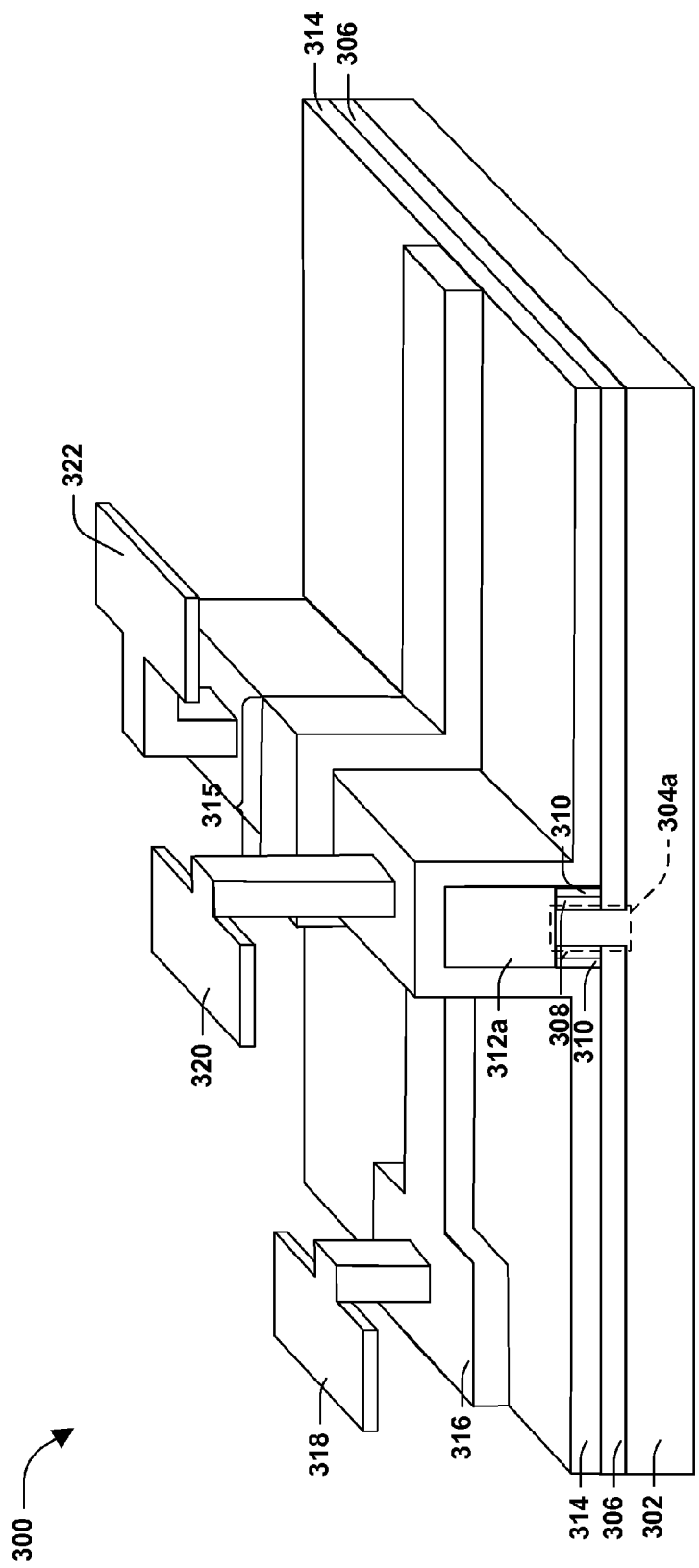
FIG. 18 is an illustration of a semiconductor device, in accordance with some embodiments.

At 108 of the first method of 100, as illustrated in FIGS. 12 and 13, the first metal alloy 312a is formed over the first active region 304a from the conductive layer 308 and the semiconductor layer 310 and the second metal alloy 312b is formed over the second active region 304b from the conductive layer 308 and the semiconductor layer 310, according to some embodiments. In some embodiments, at least one of the first metal alloy 312a or the second metal alloy 312b are formed by sputter deposition of at least one of platinum, gold, tantalum, gadolinium or titanium. In some embodiments, the photoresist 321 is removed after the formation of at least one of the first metal alloy 312a or the second metal alloy 312b. In some embodiments, at least one of the first metal alloy 312a or the second metal alloy 312b is formed by annealing at a temperature between about 250° C. to about 750° C. for a duration between about 5 s to about 70 s. In some embodiments, such as when at least one of the first metal alloy 312a or the second metal alloy 312b comprises at least one of nickel, platinum or gold, the semiconductor device 300 is annealed, such as by a rapid thermal anneal at a first anneal temperature between about 350° C. to about 650° C. for a first anneal duration between about 5 s to about 70 s. In some embodiments, such as when at least one of the first metal alloy 312a or the second metal alloy 312b comprises at least one of titanium, gadolinium or tantalum, the semiconductor device 300 is annealed, such as by a rapid thermal anneal at a second anneal temperature between about 450° C. to about 750° C. for a second anneal duration between about 5 s to about 70 s. In some embodiments, at least one of the first metal alloy 312a or the second metal alloy 312b comprises at least one of nickel, platinum, gold, tantalum, gadolinium, titanium, germanium or silicon. In some embodiments, after the formation of at least one of the first metal alloy 312a or the second metal alloy 312b the conductive layer 308 and the semiconductive layer 310 remain on sidewalls of the first active region 304a and on sidewalls of the second active region 304b of the fin 304. Turning to FIGS. 14 and 15, the insulating layer 314 is formed over the first dielectric layer 306, the semiconductive layer 310, the first metal alloy 312a and the second metal alloy 312b, according to some embodiments. In some embodiments, the insulating layer 314 comprises at least one of hafnium, zirconium or oxide. In some embodiments, the insulating layer 314 has an insulating thickness 325 between about 0.5 nm to about 1 nm. In some embodiments, the insulating layer 314 is formed by deposition. In some embodiments, the insulating layer 314 interacts with the semiconductive layer 310 over the channel region 304c to form a layer of hafnium silicon oxide (not shown). Turning to FIGS. 16 and 17, the metal layer 316 is formed over the insulating layer 314 over the channel region 304c, according to some embodiments. In some embodiments, the metal layer 316 over the insulating layer 314 over the channel region 304c comprises a gate 315. In some embodiments, the metal layer 316 comprises at least one of tantalum or nitride. In some embodiments, the metal layer 316 has a metal layer thickness 326 between about 50 nm to about 100 nm. In some embodiments, the metal layer 316 is formed by deposition. In some embodiments, such as illustrated in FIG. 18, a gate contact 318 is formed over the metal layer 316 over the substrate 302. In some embodiments, a first contact 320 is formed over the first active region 304a, such that the first contact 320 is in contact with the first metal alloy 312a. In some embodiments, a second contact 322 is formed over the second active region 304b, such that the second contact 322 is in contact with the second metal alloy 312b. In some embodiments, at least one of the gate contact 318, the first contact 320 or the second contact 322 comprises a conductive material such as metal.

Figure 2:
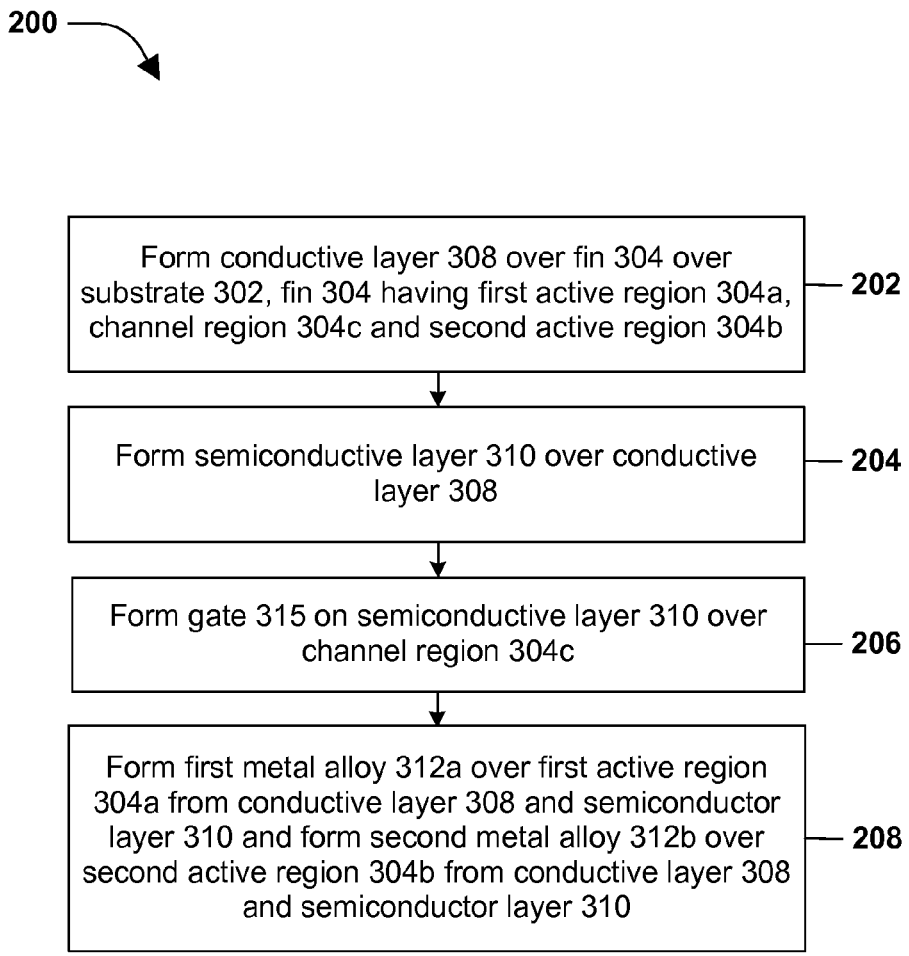
FIG. 2 is a flow diagram illustrating a method of forming a semiconductor device, in accordance with some embodiments.
Figure 19:
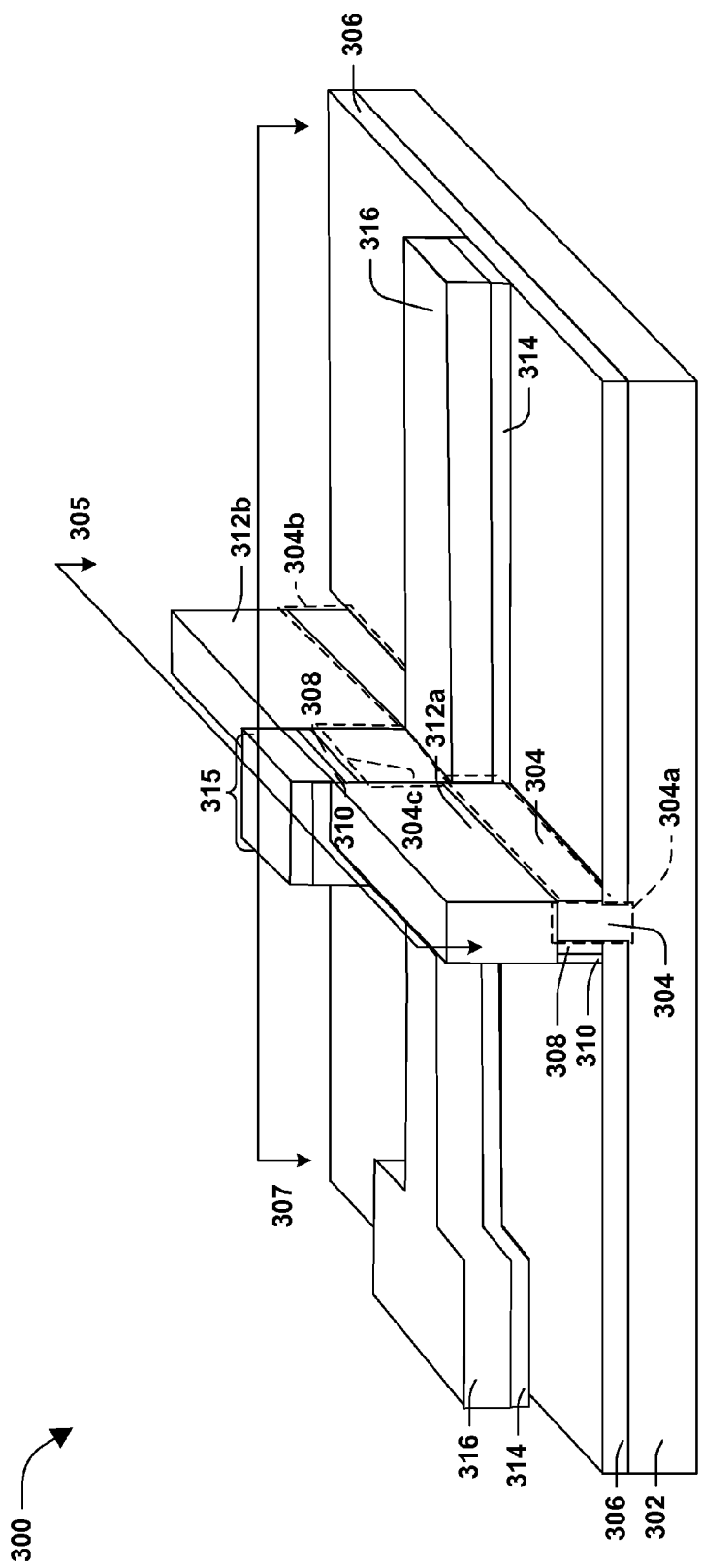
FIG. 19 is an illustration of a semiconductor device, in accordance with some embodiments.

A second method 200 of forming the semiconductor device 300 is illustrated in FIG. 2, and one or more semiconductor devices formed by such methodology are illustrated in FIGS. 19-28. Turning to FIG. 19, a 3D view of the semiconductor device 300 is illustrated where a portion of the insulating layer 314, the semiconductive layer 310 and the conductive layer 308 illustrated in FIGS. 20-28 are not shown in FIG. 19 so that features underlying the insulating layer 314, the semiconductive layer 310 and the conductive layer 308 are visible in FIG. 19. In FIG. 19 two lines 305 and 307 are drawn to illustrate cross-sections that are depicted in other Figs. A third line 305 cuts through the metal layer 316, the insulating layer 314, the first metal alloy 312a, the second metal alloy 312b, the semiconductive layer 310, the conductive layer 308, the fin 304 and the substrate 302. FIGS. 20, 22, 24 and 26 are a cross sectional view of the semiconductor device 300 taken along the third line 305 at various stages of fabrication. A fourth line 307 cuts through the metal layer 316, the insulating layer 314, the semiconductive layer 310, the conductive layer 308, the first dielectric layer 306, the fin 304 and the substrate 302, and FIGS. 21, 23, 25, and 27 are cross sectional views of the semiconductor device 300 taken along the third line 307 at various stages of fabrication.

Figure 20:
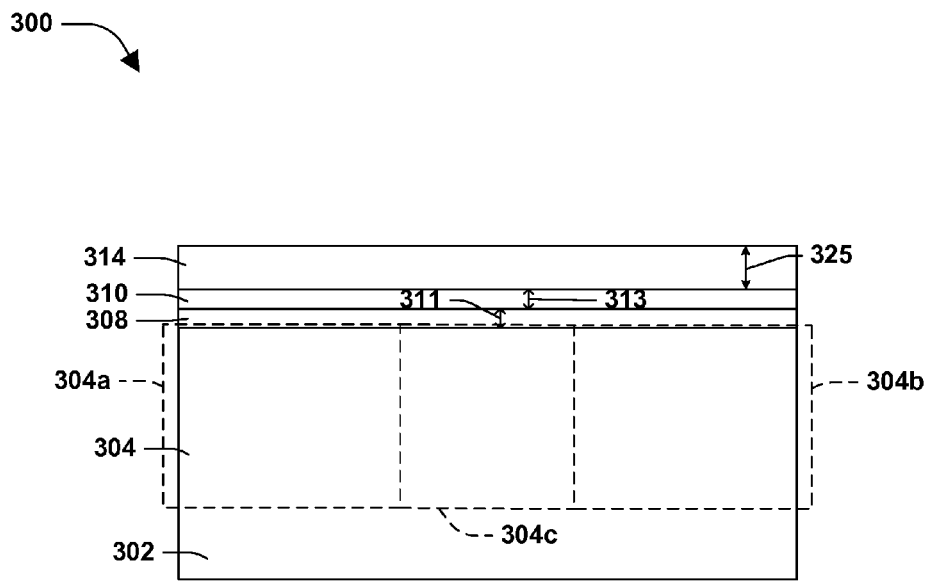
FIG. 20 is an illustration of a semiconductor device, in accordance with some embodiments.
Figure 21:
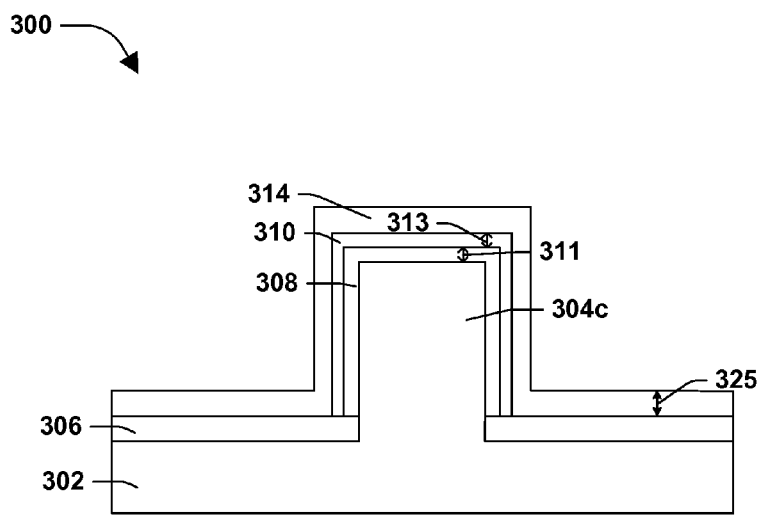
FIG. 21 is an illustration of a semiconductor device, in accordance with some embodiments.

At 202 of the second method of 200, as illustrated in FIGS. 20 and 21, the conductive layer 308 is formed over the fin 304 over the substrate 302, according to some embodiments. In some embodiments, the fin 304 is formed from the substrate 302 in the same manner as described above with regards to the fin 304 as illustrated in FIGS. 4 and 5, according to some embodiments. In some embodiments, the first dielectric layer 306 is formed in the same manner as described above with regards to the first dielectric layer 306 as illustrated in FIGS. 6-9. In some embodiments, the conductive layer 308 is formed in the same manner as described above with regards to the conductive layer 308, as illustrated in FIGS. 10 and 11.

At 204 of the second method 200, as illustrated in FIGS. 20 and 21, the semiconductive layer 310 is formed over the conductive layer 308, according to some embodiments. In some embodiments, the semiconductive layer 310 is formed in the same manner as described above with regards to the conductive layer 308, as illustrated in FIGS. 10 and 11.

Figure 22:
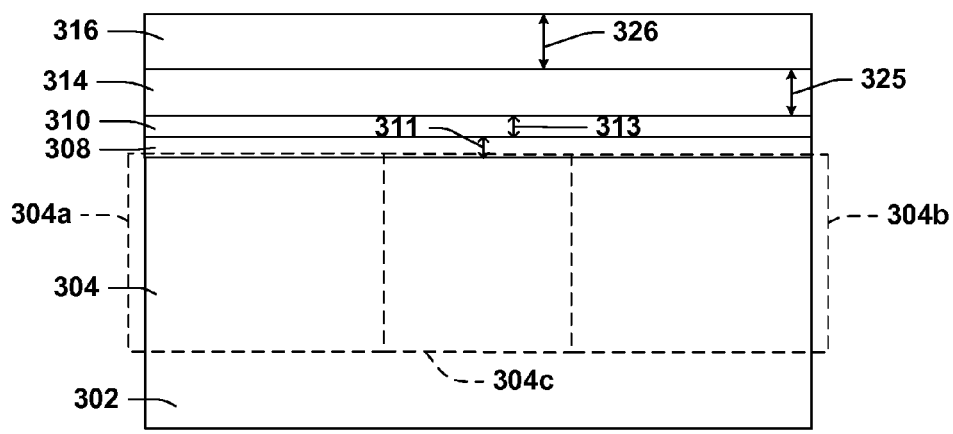
FIG. 22 is an illustration of a semiconductor device, in accordance with some embodiments.
Figure 23:
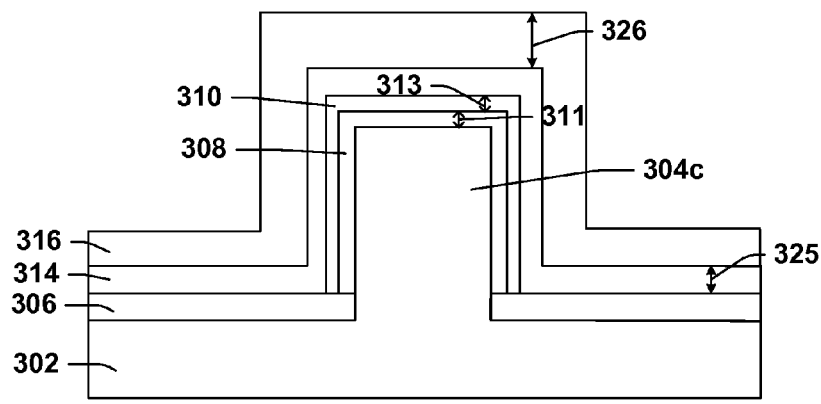
FIG. 23 is an illustration of a semiconductor device, in accordance with some embodiments.
Figure 24:
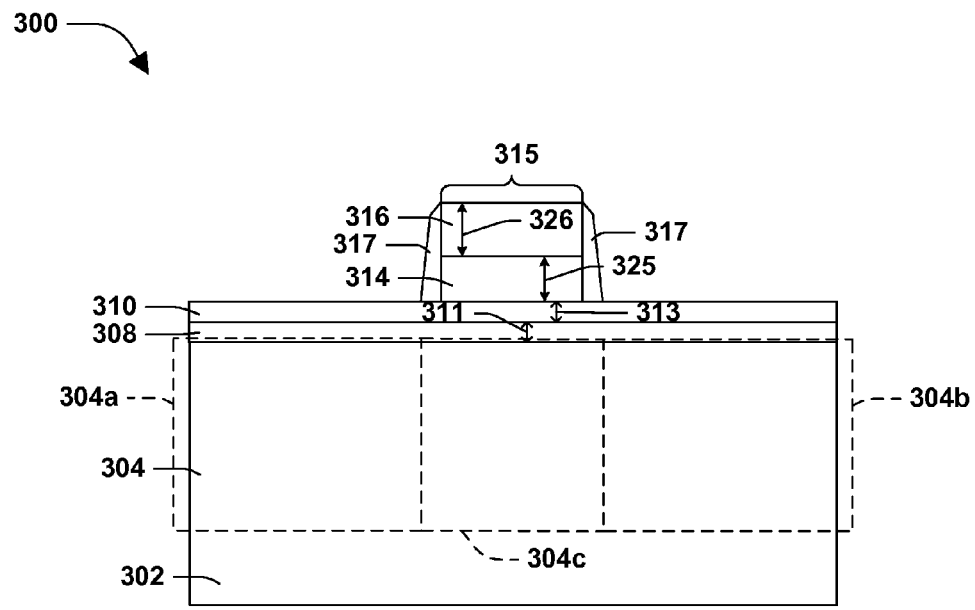
FIG. 24 is an illustration of a semiconductor device, in accordance with some embodiments.
Figure 25:
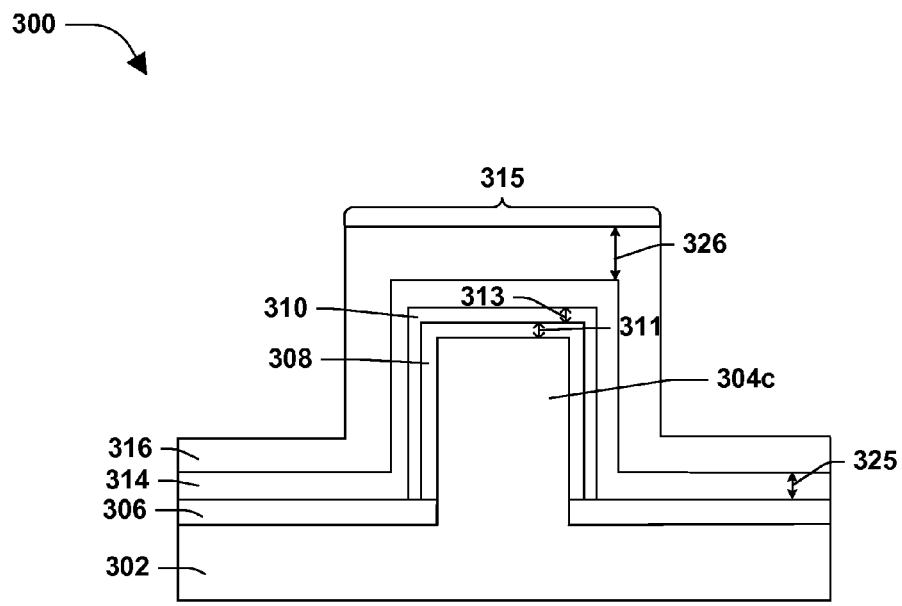
FIG. 25 is an illustration of a semiconductor device, in accordance with some embodiments.
Figure 28:
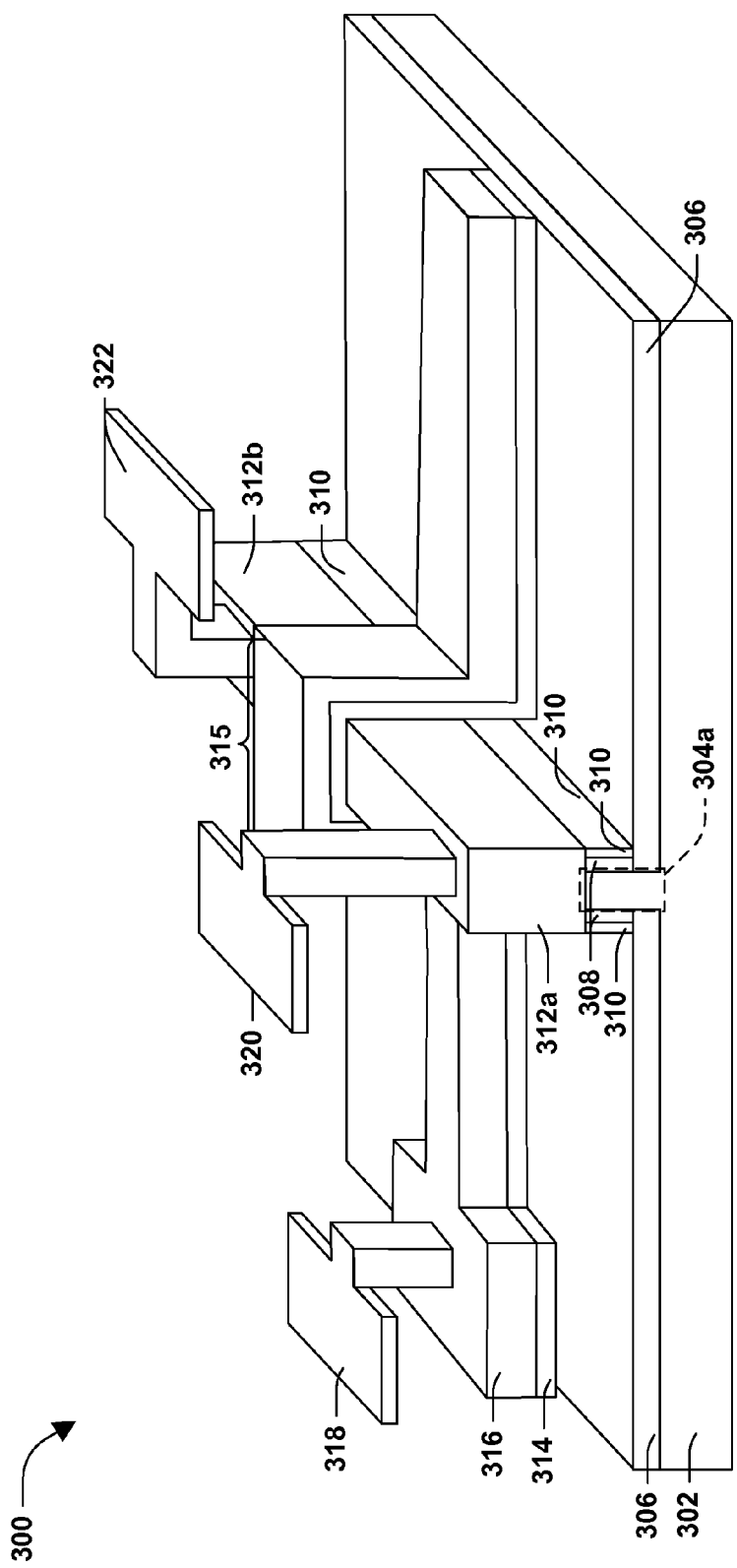
FIG. 28 is an illustration of a semiconductor device, in accordance with some embodiments.

At 206 of the second method of 200, as illustrated in FIGS. 24 and 25, the gate 315 is formed on the semiconductive layer 310 over the channel region 304c, according to some embodiments. Turing to FIGS. 20 and 21, prior to FIGS. 24 and 25, the insulating layer 314 is formed over the first dielectric layer 306 and the semiconductive layer 310, according to some embodiments. In some embodiments, the insulating layer 314 is formed in the same manner as described above with regards to the insulating layer 314, as illustrated in FIGS. 14 and 15. Turning to FIGS. 22 and 23, the metal layer 316 is formed over the insulating layer 314, according to some embodiments. In some embodiments, the metal layer 316 comprises at least one of tantalum or nitride. In some embodiments, the metal layer 316 has the metal layer thickness 326 between about 50 nm to about 100 nm. In some embodiments, the metal layer 316 is formed by deposition. In some embodiments, the metal layer 316 is formed over the substrate 302, such that the metal layer 316 is connected to the gate 315, as illustrated in FIG. 28. Turning to FIGS. 24 and 25, the metal layer 316 and the insulating layer 314 are patterned, such that the metal layer 316 and the insulating layer 314 are over the channel region 304c of the fin 304 to form the gate 315, and over portions of the substrate 302, according to some embodiments. In some embodiments, spacers 317 are formed adjacent the gate 315. In some embodiments, the spacers 317 comprise nitride.

Figure 26:
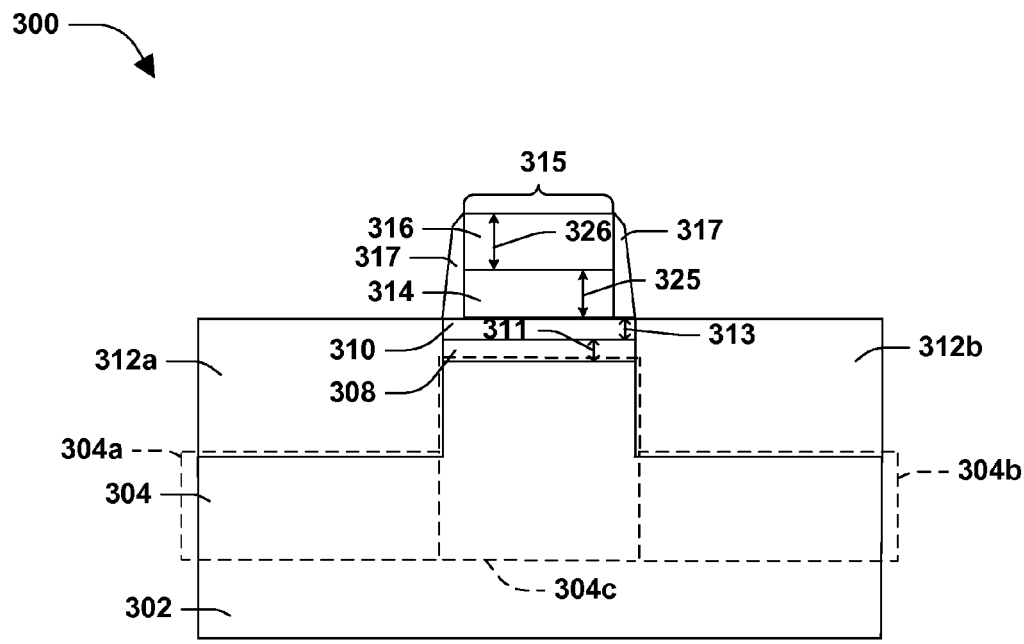
FIG. 26 is an illustration of a semiconductor device, in accordance with some embodiments.
Figure 27:
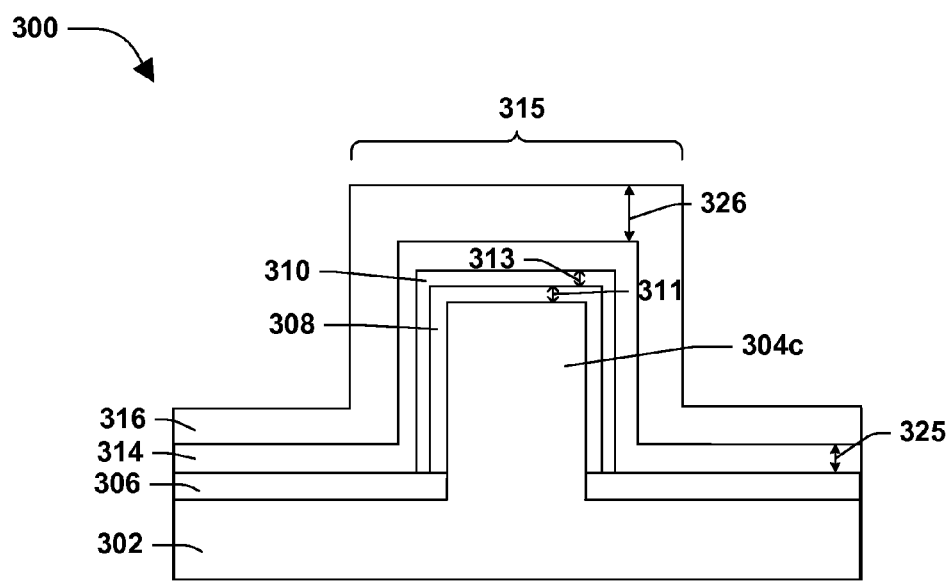
FIG. 27 is an illustration of a semiconductor device, in accordance with some embodiments.

At 208 of the second method of 200, as illustrated in FIGS. 26 and 27, the first metal alloy 312a is formed over the first active region 304a from the conductive layer 308 and the semiconductive layer 310 and the second metal alloy 312b is formed over the second active region 304b from the conductive layer 308 and the semiconductor layer 310, according to some embodiments. In some embodiments, the first metal alloy 312a and the second metal alloy 312b are formed in the same manner as described above with regards to the first metal alloy 312a and the second metal alloy 312b, as illustrated in FIGS. 12 and 13, but where the gate 315 functions as the photoresist 321 to cover the channel region 304c of the fin 304. Turning to FIG. 28, the gate contact 318 is formed over the metal layer 316, according to some embodiments. In some embodiments, the first contact 320 is formed over the first active region 304a, such that the first contact 320 is in contact with the first metal alloy 312a. In some embodiments, the second contact 322 is formed over the second active region 304b, such that the second contact 322 is in contact with the second metal alloy 312b. In some embodiments, at least one of the gate contact 318, the first contact 320 or the second contact 322 comprises a conductive material such as metal. In some embodiments, the conductive layer 308 having the conductive layer thickness 311 over the channel region 304c suppresses current leakage as compared to a conductive layer having a thickness different than the conductive layer thickness 311. In some embodiments, the semiconductive layer 310 over the conductive layer 308 in the channel region 304c reduces electro flux from the source to the drain, as compared to a channel region that does not have a semiconductive layer over a conductive layer. In some embodiments, the semiconductor device 300 having the first metal alloy 312a as at least one of the source or drain and the second metal alloy 312b as at least one of the source or drain requires a lower activation temperature than a semiconductor device that does not have a metal alloy as a source or a drain.

According to some embodiments, a semiconductor device comprises a first metal alloy over a first active region of a fin over a substrate and a second metal alloy over a second active region of the fin. In some embodiments, a conductive layer is over a channel region of the fin, between the first active region and the second active region; and a semiconductive layer is over the conductive layer.

According to some embodiments, a method of forming a semiconductor device comprises forming a conductive layer over a fin over a substrate, the fin having a first active region, a channel region and a second active region. According to some embodiments, the method of forming a semiconductor device comprises forming a semiconductive layer over the conductive layer, forming a first metal alloy over the first active region from the conductive layer and the semiconductive layer over the first active region and forming a second metal alloy over the second active region from the conductive layer and the semiconductive layer over the second active region.

According to some embodiments, a semiconductor device comprises a first metal alloy comprising at least one of nickel, platinum, gold, tantalum, gadolinium, titanium, germanium or silicon over a first active region of a fin over a substrate and a second metal alloy comprising at least one of nickel, platinum, gold, tantalum, gadolinium, titanium, germanium or silicon over a second active region of the fin. In some embodiments, a conductive layer having a conductive layer thickness between about 0.5 nm to about 5 nm is over a channel region of the fin, the channel region between the first active region and the second active region. In some embodiments, a semiconductive layer is over the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
a first metal alloy over a first active region of a fin;
a second metal alloy over a second active region of the fin;
a conductive layer over a channel region of the fin, wherein:
the channel region is between the first active region and the second active region, and
the conductive layer encloses a top surface and sidewalls of the channel region; and
a semiconductive layer over the channel region, wherein the semiconductive layer encloses a top surface and sidewalls of the conductive layer.

2. The semiconductor device of claim 1, comprising:
an insulating layer over the channel region, wherein the insulating layer encloses a top surface and sidewalls of the semiconductive layer; and
a gate electrode over the channel region, wherein the gate electrode encloses a top surface and sidewalls of the insulating layer.

3. The semiconductor device of claim 1, wherein the conductive layer further extends along a sidewall of the first active region.

4. The semiconductor device of claim 3, wherein the first metal alloy overlies a portion of the conductive layer extending along the sidewall of the first active region.

5. The semiconductor device of claim 3, wherein the semiconductive layer further extends along a sidewall of the first active region.

6. The semiconductor device of claim 5, wherein:
the first metal alloy overlies a portion of the conductive layer extending along the sidewall of the first active region; and
the first metal alloy overlies a portion of the semiconductive layer extending along the sidewall of the first active region.

7. The semiconductor device of claim 5, wherein a portion of the conductive layer extending along the sidewall of the first active region is between a portion of the semiconductive layer extending along the sidewall of the first active region and the first active region.

8. The semiconductor device of claim 1, comprising a dielectric layer underlying the conductive layer and the semiconductive layer.

9. The semiconductor device of claim 8, wherein a top surface of the dielectric layer is in contact with a bottom surface of the conductive layer and a bottom surface of the semiconductive layer.

10. A method of forming a semiconductor device comprising:
forming a conductive layer over a fin over a substrate, the fin having a first active region, a channel region and a second active region;
forming a semiconductive layer over the conductive layer;
forming a first metal alloy over the first active region from a portion of the conductive layer over the first active region and a portion of the semiconductive layer over the first active region; and
forming a second metal alloy over the second active region from a second portion of the conductive layer over the second active region and a second portion of the semiconductive layer over the second active region.

11. The method of claim 10, comprising forming a gate over the channel region of the fin and adjacent sidewalls of the fin.

12. The method of claim 11, the forming a gate comprising:
forming an insulating layer over the channel region of the fin and adjacent the sidewalls of the fin; and
forming a metal layer over the insulating layer.

13. The method of claim 10, at least one of:
the forming a first metal alloy comprising performing a sputter deposition comprising at least one of nickel, platinum, gold, tantalum, gadolinium or titanium; or
the forming a second metal alloy comprising performing a sputter deposition comprising at least one of nickel, platinum, gold, tantalum, gadolinium or titanium.

14. The method of claim 10, the forming a conductive layer comprising epitaxially growing germanium over the fin.

15. The method of claim 10, at least one of the forming a first metal alloy or the forming a second metal alloy comprising annealing at a temperature between about 250° C. to about 750° C. for a duration between about 5 s to about 70 s.

16. The method of claim 10, comprising forming a first dielectric layer over a top surface of the substrate prior to the forming a conductive layer.

17. The method of claim 10, the forming a semiconductive layer comprising epitaxially growing silicon over the conductive layer.

18. The method of claim 10, comprising at least one of:
forming a gate contact connected to a gate that is over the channel region; or
forming a first contact connected to the first metal alloy.

19. A semiconductor device comprising:
a first metal alloy over a first active region of a fin;
a second metal alloy over a second active region of the fin;
a conductive layer in direct contact with a top surface and sidewalls of a channel region of the fin and in direct contact with sidewalls of the first active region, wherein the channel region is between the first active region and the second active region; and
a semiconductive layer over the channel region, wherein the semiconductive layer is in direct contact with sidewalls of the conductive layer.

20. The semiconductor device of claim 19, wherein the first metal alloy is in direct contact with the conductive layer and the semiconductive layer.

* * * * *